United States Patent
Kim et al.

(10) Patent No.: US 8,113,903 B2
(45) Date of Patent: Feb. 14, 2012

(54) FABRICATION METHOD OF LIGHT-EMITTING DEVICE

(75) Inventors: Tae-Geun Kim, Seongnam-si (KR); Wan-Ho Lee, Goyang-si (KR)

(73) Assignee: Korea University Industrial & Academic Collaboration Foundation, Seoul (KR)

( * ) Notice: Subject to any disclaimer, the term of this patent is extended or adjusted under 35 U.S.C. 154(b) by 374 days.

(21) Appl. No.: 12/392,899

(22) Filed: Feb. 25, 2009

(65) Prior Publication Data

US 2009/0290355 A1 Nov. 26, 2009

(30) Foreign Application Priority Data

May 20, 2008 (KR) .......................... 10-2008-0046383

(51) Int. Cl.
*H01J 9/02* (2006.01)
*H01J 9/24* (2006.01)

(52) U.S. Cl. .......................................... 445/35; 445/23
(58) Field of Classification Search ...................... None
See application file for complete search history.

(56) References Cited

U.S. PATENT DOCUMENTS

| | | | | |
|---|---|---|---|---|
| 6,061,977 A | * | 5/2000 | Toyama et al. | 52/173.3 |
| 6,825,502 B2 | * | 11/2004 | Okazaki et al. | 257/98 |
| 6,914,268 B2 | * | 7/2005 | Shei et al. | 257/99 |
| 2002/0014630 A1 | * | 2/2002 | Okazaki et al. | 257/79 |
| 2005/0056857 A1 | * | 3/2005 | Okazaki et al. | 257/98 |
| 2006/0284205 A1 | * | 12/2006 | Liu | 257/98 |
| 2009/0290355 A1 | * | 11/2009 | Kim et al. | 362/307 |

OTHER PUBLICATIONS

Machine translation of KR10-2008-0015922A.*

* cited by examiner

*Primary Examiner* — Toan Ton
*Assistant Examiner* — Britt D Hanley
(74) *Attorney, Agent, or Firm* — IPLA P.A.; James E. Bame

(57) ABSTRACT

A flip-chip type light-emitting device and manufacturing method thereof provides a curved surface formed on the transparent electrode layer and a reflective layer transferred with the curved surface of the transparent electrode layer is additionally formed on the transparent electrode layer, so that the light generated from the active layer is incident to the reflective layer through the p-type nitride layer and the transparent electrode layer, and then is reflected from the curved surface of the reflective layer so as to exhibit an effect of extracting a larger amount of light in a vertical direction as compared to the conventional light-emitting device.

5 Claims, 6 Drawing Sheets

FABRICATION METHOD OF LIGHT-EMITTING DEVICE

CROSS REFERENCES

Applicant claims foreign priority under Paris Convention and 35 U.S.C. §119 to Korean Patent Application No. 10-2008-0046383, filed May 20, 2008 with the Korean Intellectual Property Office, where the entire contents are incorporated herein by reference.

BACKGROUND OF THE INVENTION

1. Field of the Invention

The present invention relates to a light-emitting device and manufacturing method thereof, and more particularly, to a flip-chip type light-emitting device having improved light extraction efficiency and heat emission efficiency, and a manufacturing method thereof.

2. Background of the Related Art

Recently, along with the development of the optics and electronics fields, the industrial demand for a transparent conducting film with high light transmittance and electrical conductivity is increasing. Such a transparent conducting film is necessarily used for a flat panel display device, a solar cell, a transparent touch panel and the like.

Semiconductor light-emitting device which converts electrical signals into optical signals using the characteristics of semiconductors, i.e., light-emitting devices such as light-emitting diodes (LEDs) or laser diode (LDs) are widely researched and put into practice use in a variety of application fields such as illumination, optical communication, multiplex communication and the like. Such semiconductor light-emitting devices are widely used as light sources of means for transmitting data or writing/reading data in communication devices or devices such as disk players.

FIG. 1 is a cross-sectional view illustrating one example of a conventional nitride-based semiconductor light-emitting device according to the prior art.

Referring to FIG. 1, the conventional nitride-based semiconductor light-emitting device includes a n-type nitride semiconductor layer 12, an active layer 13 having a multi-quantum well structure, a p-type nitride semiconductor layer 14 which are sequentially formed on a substrate 11. In this case, the p-type nitride semiconductor layer 14 and the active layer 13 are partially sequentially etched so as to externally expose the n-type nitride semiconductor layer 12. Thereafter, an n-type electrode layer 15 is formed on the exposed n-type nitride semiconductor layer 12 and a p-type electrode layer 16 is formed on the p-type nitride semiconductor layer 14.

As described above, after the semiconductor light-emitting device has been completed, wire bonding is performed on each electrode layer. Performing the wire bonding on each LED chip entails a problem in that it requires much time and the manufacturing cost of the LED increases. A flip-chip type light-emitting device has been developed to solve such a problem.

FIG. 2 is a cross-sectional view illustrating a conventional flip-chip type light-emitting device according to the prior art.

As shown in FIG. 2, the flip-chip type light-emitting device includes a n-type nitride semiconductor layer 22, an active layer 23 having a multi-quantum well structure and a p-type nitride semiconductor layer 24 which are sequentially formed on a substrate 21. In this case, the p-type nitride semiconductor layer 24 and the active layer 23 are partially removed so that a part of the top surface of the n-type nitride semiconductor layer 22 is exposed externally. An n-type electrode layer 25 is formed on the top surface of the exposed n-type nitride semiconductor layer 22 and a p-type electrode layer 26 is formed on the p-type nitride semiconductor layer 24.

After the thus formed light-emitting device is turned upside down, the n-type electrode layer 25 and the p-type electrode layer 26 are connected to conductive patterns 29 formed on a submount 27 by means of a bump 28.

In the meantime, the flip-chip type light-emitting device permits a reflective layer to be interposed between the p-type nitride semiconductor layer 24 and the p-type electrode layer 26 to reflect light incident to the p-type electrode layer toward the transparent substrate so as to improve luminance and easily externally emit the heat generated inside the light-emitting device through the electrodes.

However, Ag used as a material for the reflective layer has a problem in that the cohesive force between the Ag and the p-type nitride semiconductor layer 24 is very low, which causes a product defect and makes it difficult to secure a stable contact resistance. Besides, an example of other metals usable as a material for the reflective layer includes Al, Ni, Ti, Pt and the like. But these metals encounter a problem in that they have a relatively low reflection efficiency as compared to Ag.

SUMMARY OF THE INVENTION

Therefore, the present invention has been made in view of the above problems, and it is an object of the present invention to provide a light-emitting device which is improved in light extraction efficiency and heat emission efficiency and has an excellent cohesive force between a p-type nitride semiconductor layer and a reflective layer, a method for manufacturing the same.

In order to accomplish the above object, in one aspect, the present invention provides a method of fabricating a light-emitting device, including the steps of: (a) forming a light-emitting layer on a substrate so as to emit light; (b) forming a transparent electrode layer on the light-emitting layer, the transparent electrode layer having curved surface formed thereon; and (c) forming a reflective layer on the transparent electrode layer in such a fashion that the curved surface formed on the transparent electrode layer is transferred.

Also, the step (b) may include a step of forming the transparent electrode layer on the light-emitting layer, forming photoresists on the transparent electrode layer, and performing a wet etching process on the transparent electrode layer formed with the photoresists to remove the photoresists to thereby form a curved surface on the transparent electrode layer.

In addition, the step (b) may include the steps of: (b1) disposing spherical particles on the light-emitting layer; (b2) filling a transparent electrode layer-forming material in spaces between spaces defined between the spherical particles, and crystallizing the transparent electrode layer-forming material; and (b3) removing the spherical particles.

Also, the step (b1) may include a step of coating a solution having the spherical particles contained therein on the light-emitting layer, and vaporizing a solvent of the solution to cause the spherical particles to be arranged in an opal structure on the light-emitting layer.

Besides, the step (b20 may include a step of filling the transparent electrode layer in spaces between spaces defined between the spherical particles up to a height corresponding to half the height of each spherical particle, and the step (b3) may include a step of performing a buffered oxide etch (BOE)

or burning process depending on a material of which the spherical particles are formed to remove the spherical particles.

Further, the spherical particles may be formed of a latex-based material or a silica-based material.

In order to accomplish the above object, in another aspect, the present invention provides a light-emitting device including: a substrate; a light-emitting layer formed on a substrate so as to emit light; a transparent electrode layer formed on the light-emitting layer, the transparent electrode layer having curved surface formed on the top surface thereof; and a reflective layer formed on the transparent electrode layer in such a fashion that the curved surface formed on the transparent electrode layer is transferred so as to reflect the light generated from the light-emitting layer toward the light-emitting layer.

Also, the curved surfaces formed on the transparent electrode layer and the reflective layer may have the same curvature as each other.

DETAILED DESCRIPTION OF THE PREFERRED EMBODIMENT

The preferred embodiments of the invention will be hereinafter described in detail with reference to the accompanying drawings.

Figure 1:
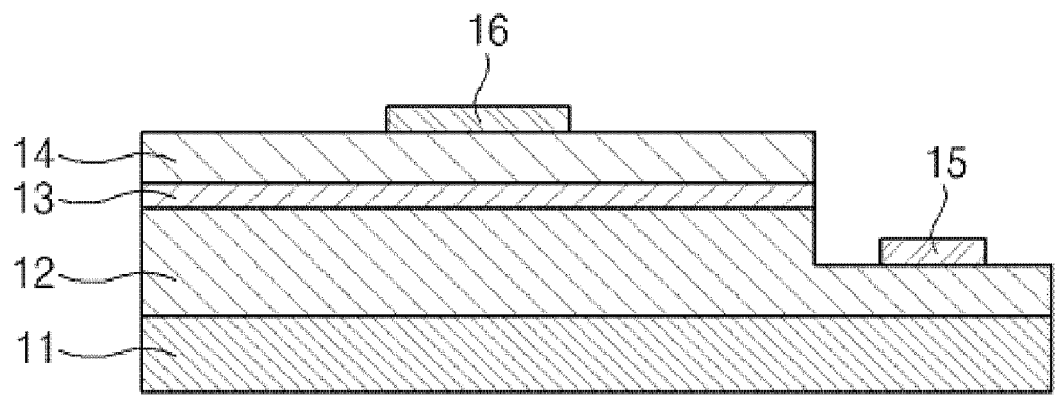
FIG. 1 is a cross-sectional view illustrating one example of a conventional nitride-based semiconductor light-emitting device according to the prior art.
Figure 2:
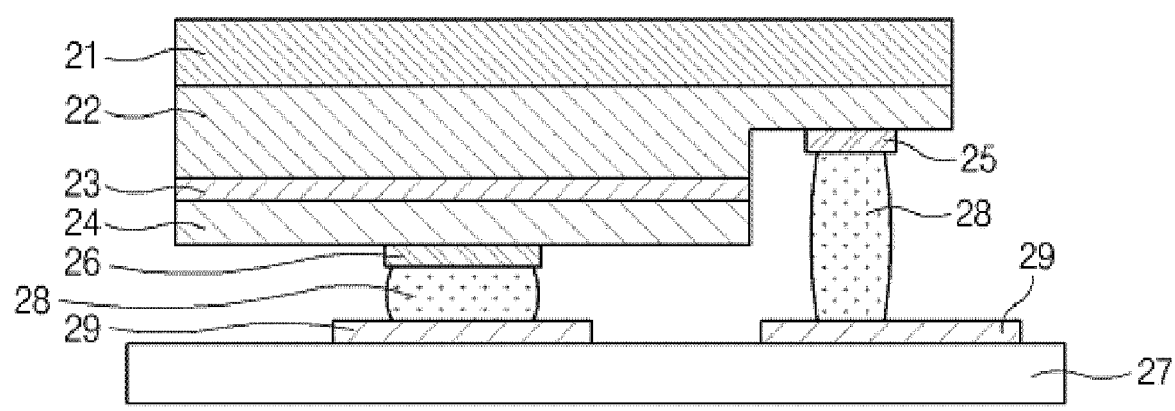
FIG. 2 is a cross-sectional view illustrating a conventional flip-chip type light-emitting device according to the prior art.
Figure 3:
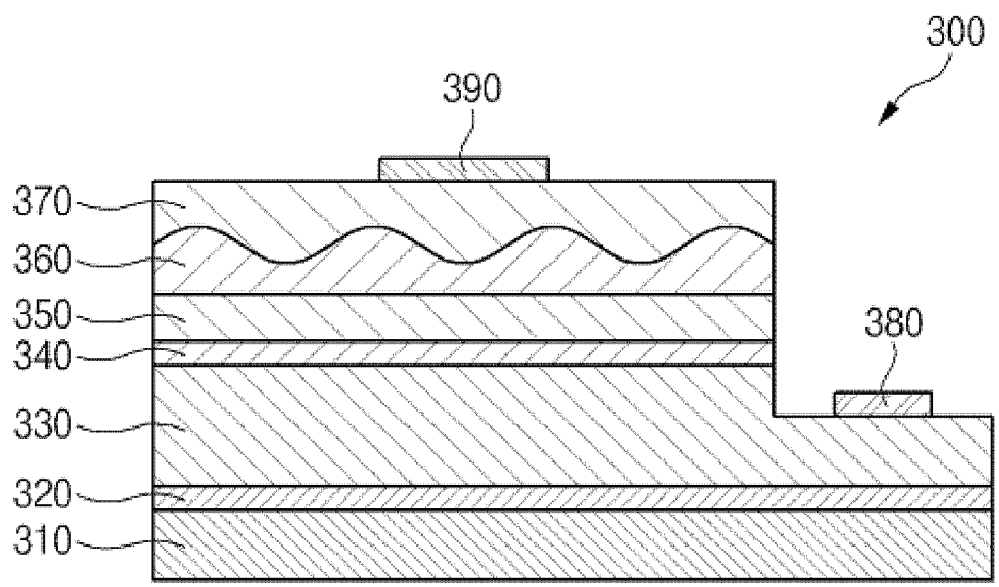
FIG. 3 is a cross-sectional view illustrating the structure of a light-emitting device according to a preferred embodiment of the present invention.
Figure 4:
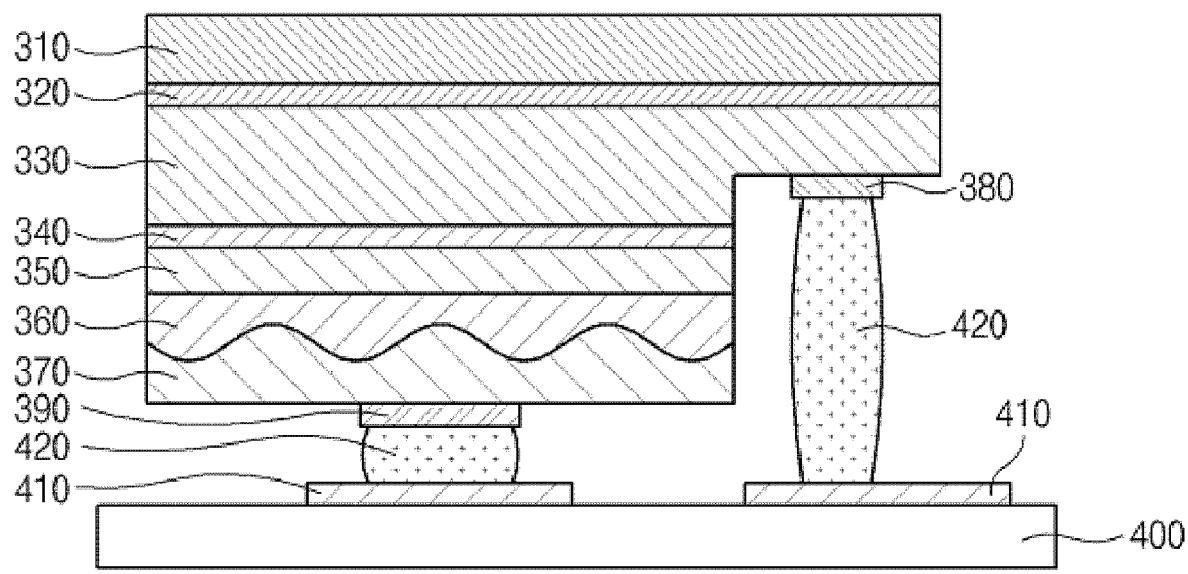
FIG. 4 is a cross-sectional view illustrating a state where the light-emitting device of FIG. 3 is coupled to a submount substrate.

FIG. 3 is a cross-sectional view illustrating the structure of a light-emitting device according to a preferred embodiment of the present invention, and FIG. 4 is a cross-sectional view illustrating a state where the light-emitting device of FIG. 3 is coupled to a submount substrate.

Referring to FIG. 3, the light-emitting device of the present invention includes a buffer layer 320, an n-type nitride layer 330, an active layer 340, and a p-type nitride layer 350 which are sequentially formed on a substrate 301 through the same process as that in the conventional method.

A material for the substrate 310 may use sappire, SiC, GaN and the like. But in the preferred embodiment of the present invention, the substrate 310 employs a sappire substrate having excellent light transmission. The buffer layer 320 employs a non-doped gallium nitride (GaN) and the active layer 340 may have a single-quantum well structure or a multi-quantum well structure.

After the p-type nitride layer 350 has been formed on the active layer 340, a transparent electrode layer 360 and a reflective layer 370 are sequentially formed on the p-type nitride layer 350 and a p-type electrode layer 390 is formed on the reflective layer 370. Then, the reflective layer 370, the transparent electrode layer 360, the p-type nitride layer 350 and the active layer 340 are sequentially etched so as to externally expose the n-type nitride layer 330 at a side region of the entire structure of the light-emitting device, and an n-type electrode layer 380 is formed on the externally exposed surface of the n-type nitride layer 330.

In this case, the interface between the transparent electrode layer 360 and the reflective layer 370 is formed as a curved surface as shown in FIG. 3. A process of forming the transparent electrode layer 360 and the reflective layer 370 will be described later with reference to FIGS. 5a to 7e.

Referring to FIG. 4, After the light-emitting device 300 manufactured according to the preferred embodiment of the present invention is turned upside down, the n-type and p-type electrode layers 380 and 390 are connected to conductive patterns 410 formed on a submount substrate 400 by means of bumps 420 in the same manner as that in the conventional prior art to thereby complete the light-emitting device.

Figure 5A:
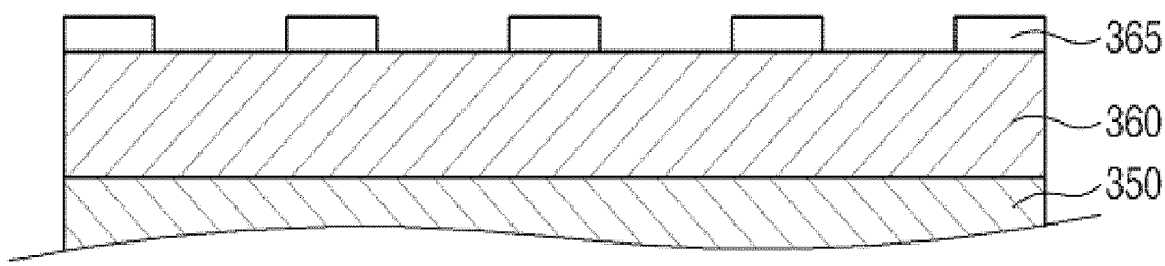
FIGS. 5a to 5c are cross-sectional views illustrating a process of forming a transparent electrode layer and a reflective layer according to a preferred embodiment of the present invention.
Figure 5B:
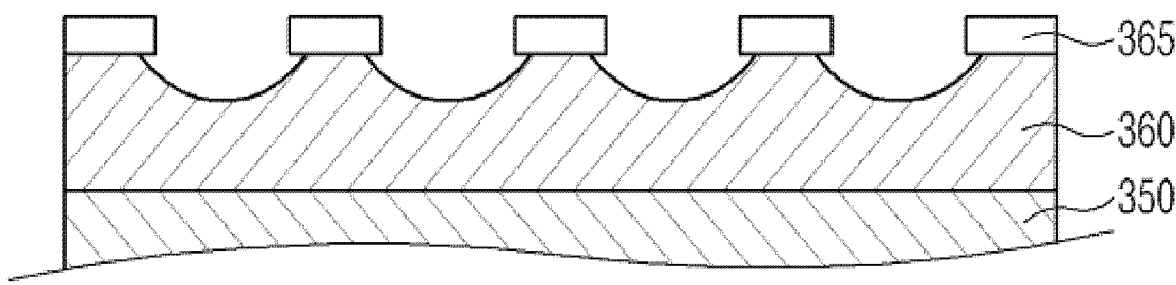
Figure 5C:
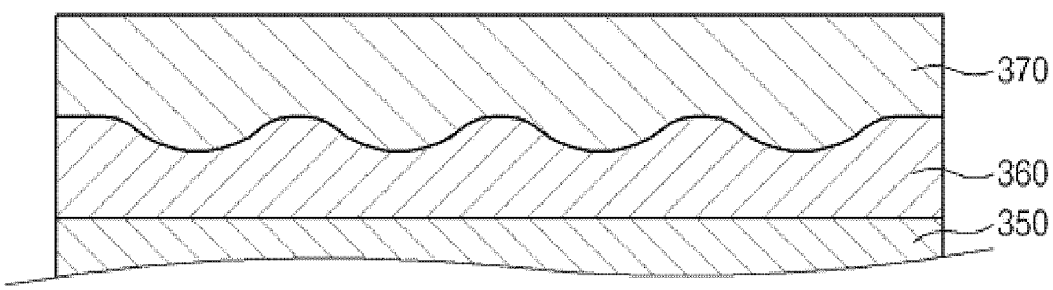

FIGS. 5a to 5c are cross-sectional views illustrating an example of a process of forming the transparent electrode layer 360 and the reflective layer 370 according to a preferred embodiment of the present invention.

Referring to FIG. 5a, the transparent electrode layer 360 having a band gap greater than that of the p-type nitride layer 350 is formed on the p-type nitride layer 350 using a known deposition method such as a sputtering deposition method, and photoresists 365 are formed at regular intervals on the transparent electrode layer 360. A material used to form the transparent electrode layer 360 may employ ITO, ZnO and NiO.

Thereafter, as shown in FIG. 5b, when the transparent electrode layer 360 is etched using a wet etching method, the etching depth is deeper at central regions of between two adjacent photoresists on the top surface of the transparent electrode layer 360 on which the photoresists 365 are not formed whereas the etching depth is shallower as it goes toward regions on the top surface of the transparent electrode layer 360 on which the photoresists 365 are formed, such that curved surface are formed on the transparent electrode layer 360 on the whole.

Thereafter, as shown in FIG. 5c, the photoresist 365 are removed and the reflective layer 370 are formed on the transparent electrode layer 360 formed with the curved surface. As a material for the reflective layer 370, all kinds of materials for a general reflective layer such as Al, Ag and the like can be used. But, the preferred embodiment of the present invention employs Al to form the reflective layer 370.

Referring to FIGS. 5a to 5c, the curved surface of the transparent electrode layer 360 are transferred through the above-mentioned process so that the reflective layer 370 having the curved surface is formed. At this time, the shape of the curved surface formed on the reflective layer 370 can be controlled depending on the size of the photoresist 365 used for etching, an etching solution, the etching time, and the like.

Figure 6:
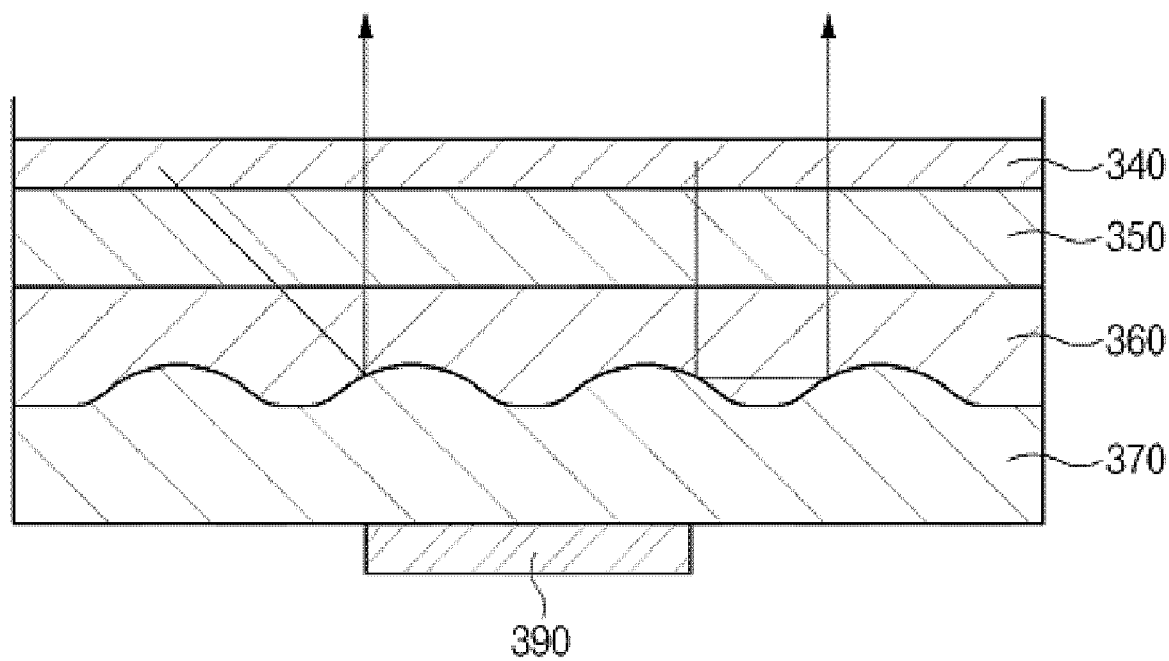
FIG. 6 is a cross-sectional view illustrating an example in which light generated from an active layer is reflected from a reflective layer.

FIG. 6 is a cross-sectional view illustrating an example in which light generated from the active layer 340 is reflected from the reflective layer 370.

Referring to FIG. 6, the light generated from the active layer 340 is incident to the reflective layer 370 through the p-type nitride layer 350 and the transparent electrode layer 360, and then is reflected from the curved surface of the reflective layer 370. Thus, the inventive light-emitting device exhibits an effect of extracting a larger amount of light in a vertical direction as compared to the conventional light-emitting device.

In addition, the inventive light-emitting device exhibits an effect of enhancing heat emission efficiency as compared to the conventional prior art since the reflective layer 370 having a high heat conductivity is formed on the outer surface of the transparent electrode layer 360.

In the meantime, FIGS. 7a to 7e are cross-sectional views illustrating a process of forming a reflective layer 370 having curved surface formed thereon according to another preferred embodiment of the present invention.

Figure 7A:
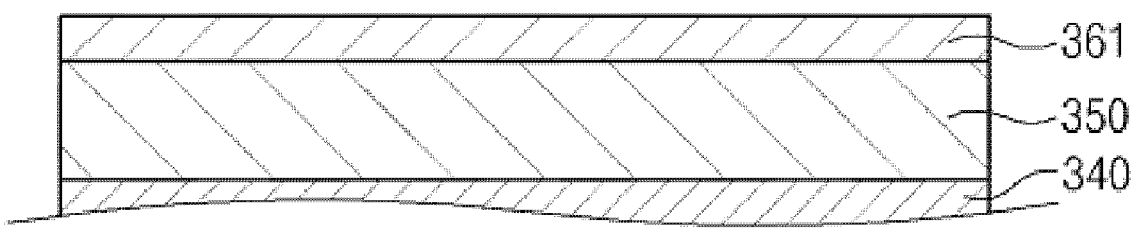
FIGS. 7a to 7e are cross-sectional views illustrating a process of forming a reflective layer having curved surface formed thereon according to another preferred embodiment of the present invention.

First, referring to FIG. 7a, the material of which the transparent electrode layer 360 is formed is spin-coated to a thickness of 5 to 200 nm on the p-type nitride layer 350 formed as described above to thereby form a thin film 361. At this time, as the material of which the transparent electrode layer 360 is formed, all kinds of materials used to form a general reflective layer in the prior art can be used. But, the preferred embodiment of the present invention can employ ITO, ZnO and NiO to form the transparent electrode layer 360.

Figure 7B:
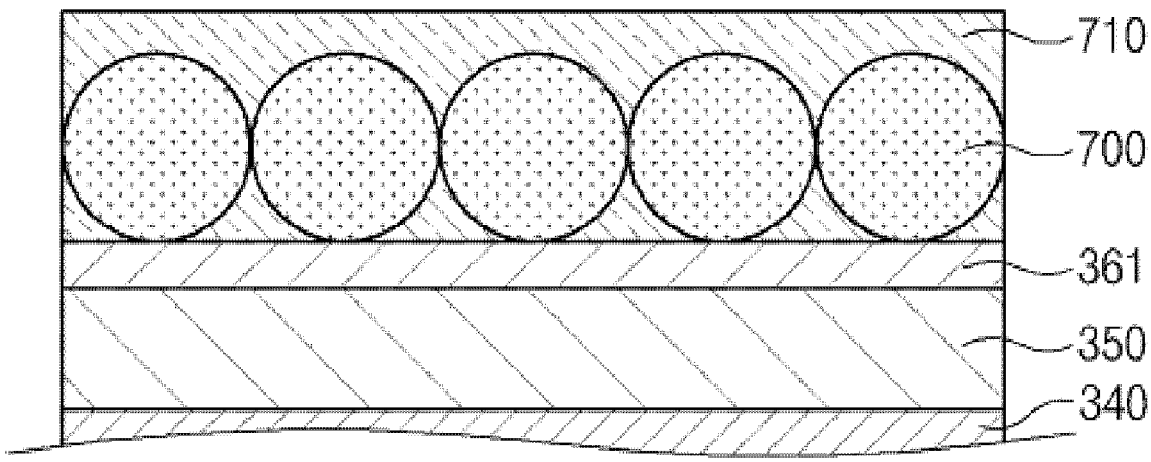

After the thin film 361 has been formed on the p-type nitride layer 350, as shown in FIG. 7b, a solution 710 having spherical particles 700 contained therein, each having a given sized diameter, is coated on the thin film 361. In this case, each spherical particle preferably has a diameter of 50 to 200 nm, and may be formed of a latex-based material or a silica-based material. Further, a solvent of the solution containing the spherical particles is preferably a volatile material.

Figure 7C:
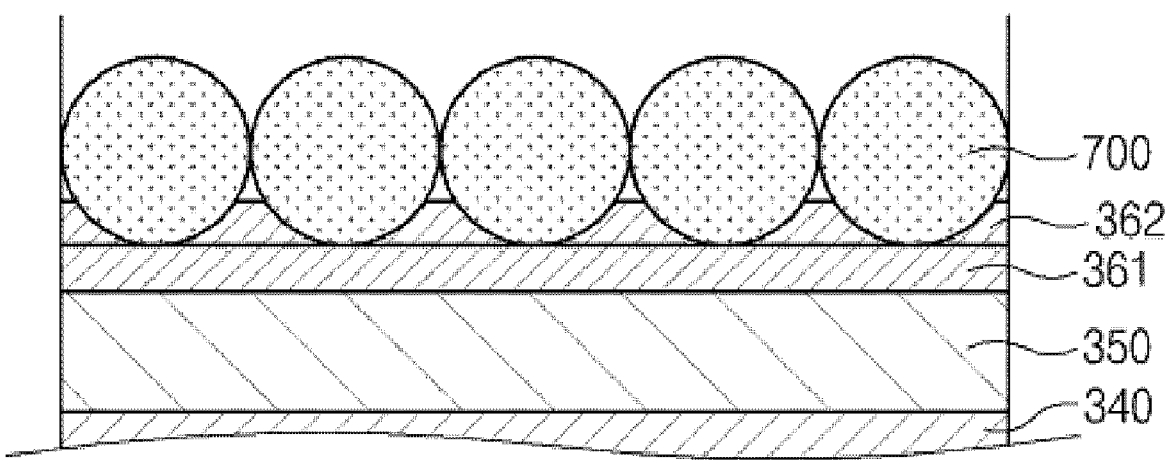
Figure 7D:
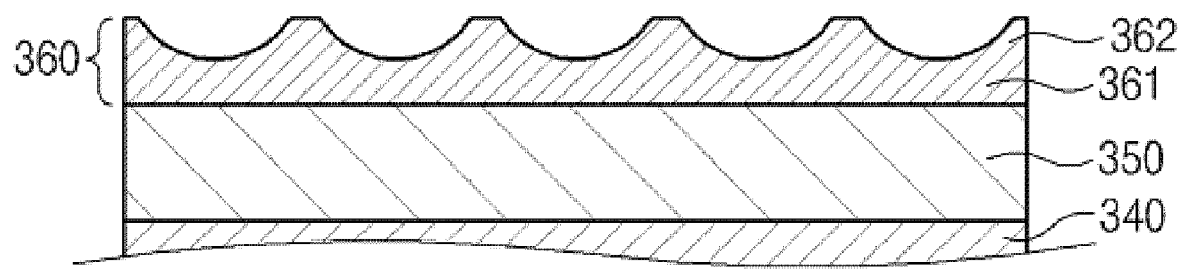
Figure 7E:
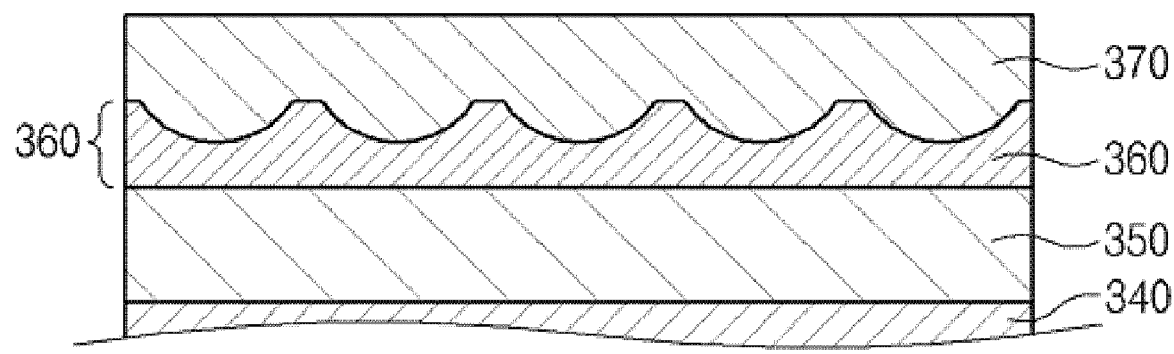

When the solution 710 containing the spherical particles has been coated on the thin film 361 and then the volatile solvent contained in the solution is vaporized, as shown in FIG. 7c, the spherical particles 710 are arranged in an opal structure on the semiconductor substrate 350 formed with the thin film 361. Thereafter, the same material of that used to form the thin film 361 are coated in a sol-gel method on the thin film 361 to be approximately half or lower than the height of each spherical particle arranged on the thin film 361. Then, as shown in FIG. 7c, a transparent electrode layer-forming material 362 is infiltrated between the spherical particles 700 arranged in the opal structure to fill spaces defined between the spherical particles. At this time, firing and annealing is performed on the transparent electrode layer-forming material 362 to crystallize the transparent electrode layer-forming material 362 infiltrated between the spherical particles 700 together with the thin film 361.

When the transparent electrode layer-forming material is cured, a buffered oxide etch (BOE) or burning process is performed to remove the spherical particles 700 to thereby form a transparent electrode layer 360 of an inverted-opal structure. At this time, in the case where the spherical particles 700 are formed of a silica-based material, the BOE is performed to remove the spherical particles 700 whereas in the case where the spherical particles 700 are formed of a latex-based material, the burning is performed to remove the spherical particles 700.

Through the above-mentioned process, when the transparent electrode layer 360 formed with the curved surface is formed, a reflective layer 370 is deposited on the transparent electrode layer 360. As described above, as a material for the reflective layer 370, all kinds of materials for a general reflective layer such as Al, Ag and the like can be used. But, the preferred embodiment of the present invention employs Al to form the reflective layer 370. A curved surface is formed on the reflective layer 370 formed through such a process in such fashion as to have the same curvature as that of the curved surface formed on the transparent electrode layer 360.

As described above, according to the flip-chip type light-emitting device of the present invention, a curved surface is formed on the transparent electrode layer and a reflective layer transferred with the curved surface of the transparent electrode layer is additionally formed on the transparent electrode layer, so that the light generated from the active layer is incident to the reflective layer through the p-type nitride layer and the transparent electrode layer, and then is reflected from the curved surface of the reflective layer so as to exhibit an effect of extracting a larger amount of light in a vertical direction as compared to the conventional light-emitting device, thereby improving light extraction efficiency.

In addition, the inventive light-emitting device exhibits an effect of enhancing heat emission efficiency as compared to the conventional prior art since the reflective layer 370 having a high heat conductivity is formed on the outer surface of the transparent electrode layer.

While the present invention has been described with reference to the particular preferred embodiments, it will be understood by those skilled in the art that various modifications and variations can be made to the present invention without departing from the spirit and scope of the appended claims. Therefore, the disclosed embodiments should be considered in view of explanation, but no limitation. The technical scope of the present invention is taught in the claims, but not the detailed description, and all the differences in the equivalent scope thereof should be construed as falling within the present invention.

What is claimed is:

1. A method of fabricating a light-emitting device, comprising the steps of:
    (a) forming a light-emitting layer on a substrate so as to emit light;
    (b) forming a transparent electrode layer on the light-emitting layer, the transparent electrode layer having curved surface formed thereon; and
    (c) forming a reflective layer on the transparent electrode layer in such a fashion that the curved surface formed on the transparent electrode layer is transferred,
    wherein the step (b) further comprises the steps of:
    (b1) disposing spherical particles on the light-emitting layer;
    (b2) filling a transparent electrode layer-forming material in spaces between spaces defined between the spherical particles, and crystallizing the transparent electrode layer-forming material; and
    (b3) removing the spherical particles.

2. The method according to claim 1, wherein the step (b) further comprises, before the step (b1), a step of forming photoresists on the transparent electrode layer, and performing a wet etching process on the transparent electrode layer formed with the photoresists to remove the photoresists to thereby form a curved surface on the transparent electrode layer.

3. The method according to claim 1, wherein the step (b1) comprises a step of coating a solution having the spherical particles contained therein on the light-emitting layer, and vaporizing a solvent of the solution to cause the spherical particles to be arranged in an opal structure on the light-emitting layer.

4. The method according to claim 1, wherein the step (b20 comprises filling the transparent electrode layer in spaces between spaces defined between the spherical particles up to a height corresponding to half the height of each spherical particle, and the step (b3) comprises performing a buffered oxide etch (BOE) or burning process depending on a material of which the spherical particles are formed to remove the spherical particles.

5. The method according to claim 1, wherein the spherical particles are formed of a latex-based material or a silica-based material.

* * * * *